US007602198B2

(12) United States Patent
Masri et al.

(10) Patent No.: US 7,602,198 B2
(45) Date of Patent: Oct. 13, 2009

(54) ACCURACY ENHANCING MECHANISM AND METHOD FOR CURRENT MEASURING APPARATUS

(75) Inventors: Farid E. Masri, Dublin, OH (US); Christopher S. Sherman, Dublin, OH (US)

(73) Assignee: DynAmp, LLC, Grove City, OH (US)

( * ) Notice: Subject to any disclaimer, the term of this patent is extended or adjusted under 35 U.S.C. 154(b) by 194 days.

(21) Appl. No.: 11/874,944

(22) Filed: Oct. 19, 2007

(65) Prior Publication Data

US 2009/0102454 A1 Apr. 23, 2009

(51) Int. Cl.
*G01R 31/308* (2006.01)
*G01R 9/02* (2006.01)

(52) U.S. Cl. ....................................... 324/753; 356/477

(58) Field of Classification Search ....................... None
See application file for complete search history.

(56) References Cited

U.S. PATENT DOCUMENTS 4,491,795 A 1/1985 Gelinas
5,032,026 A * 7/1991 Jouve et al. ................. 356/478
5,521,774 A 5/1996 Parks et al.
5,677,622 A 10/1997 Clarke
5,694,216 A * 12/1997 Riza ........................... 356/485
5,715,080 A 2/1998 Scerbak
6,862,126 B2 * 3/2005 Ishiwada et al. ............ 356/454
6,886,365 B2 * 5/2005 Rumpf et al. ............... 356/477
6,915,048 B2 * 7/2005 Kersey et al. ................. 385/50
7,355,684 B2 * 4/2008 Jeffers et al. ................ 356/480
2004/0086228 A1 * 5/2004 Rumpf et al. ................. 385/39
2004/0150830 A1 8/2004 Chan
2005/0231730 A1 * 10/2005 Jeffers et al. ................ 356/480
2006/0268408 A1 * 11/2006 Toussaint et al. ............ 359/487
2008/0043245 A1 * 2/2008 Needham .................... 356/480

* cited by examiner

*Primary Examiner*—Jermele M Hollington
(74) *Attorney, Agent, or Firm*—Jason H. Foster; Kremblas, Foster, Phillips & Pollick

(57) ABSTRACT

An optical interferometer used to measure the current in a conductor, where the gap between the mirror and the quarter wave plate is minimized, and the gap is shielded magnetically. Additionally, at least the modulator is shielded, and preferably the case containing many of the components, such as the integral number of turns of optical fiber in a coil, is magnetically shielded. By shielding the components, and reducing the gap between the quarter wave plate and the mirror, the error in the current measurement is substantially reduced.

25 Claims, 6 Drawing Sheets

50 34 33
30
36

ACCURACY ENHANCING MECHANISM AND METHOD FOR CURRENT MEASURING APPARATUS

BACKGROUND OF THE INVENTION

1. Field of the Invention

This invention relates generally to a device and method for enhancing the accuracy of a current measuring apparatus, and more particularly where the current measuring apparatus uses optical sensing technology.

2. Description of the Related Art

Conventional high current (up to about 500 KA) measurement equipment uses Hall effect technology to measure the magnetic field around a conductor. Electricity carried through a conductor produces a magnetic field that varies with current, and conventional measurement equipment uses an electronic sensor (Hall sensor) that varies its output voltage in response to changes in magnetic field density. A Hall sensor in close proximity to the conductor can thus be used to effectively measure the current without interrupting the circuit or making electrical contact with the conductor. Typically, the Hall sensor is integrated with a wound core that surrounds the conductor to be measured. Conventional Hall technology current measuring equipment has the disadvantages of being expensive, large, heavy and time-consuming to install.

Optical devices can also be used to measure current. Such devices are interferometers that utilize the Faraday effect, in which there is an interaction between light and the magnetic field produced around the conductor, to measure current. Existing technology for carrying out this measurement does not have sufficient accuracy under all circumstances. The reason for this is explained below.

An optical interferometer of the type described, such as the Fiber Optic Current Sensor made and sold by Nxtphase, works on the principle that the speeds of right handed circularly polarized (RHCP) and left handed circularly polarized (LHCP) light waves are oppositely affected by a magnetic field. A fiber optic circuit is arranged in such a way that two beams, one that is RHCP and one that is LHCP, are sent through an optical fiber that extends through the magnetic field around the conductor, and the total phase difference accumulated between the two beams is measured. The total phase difference is proportional to the line integral of the magnetic field along the path of the sensing fiber. Thus, by extending the optical fiber around the current carrying conductor an integral number of times, the sensor measures the closed path integral of the magnetic field around the conductor. By Ampere's Law, this is equal to the current carried in the conductor.

The principle of reciprocity ensures that common mode effects are cancelled, and thus path non-idealities cannot create a phase difference between the two beams. However, the influence of the magnetic field through the Faraday effect is non-reciprocal. This is because the sensing path is terminated in a mirror, at which a RHCP beam is converted to a LHCP beam upon reflection, and vice versa. Thus, the outbound RHCP light beam returns from the mirror as a LHCP beam, and vice versa. Both beams travel through the sensing path as both RHCP and LHCP beams, only in opposite directions. As the sense of circular polarization is reversed upon reflection at the mirror, so also is the direction of propagation relative to the magnetic field. Thus, when compared to a unidirectional sensor configuration, the "round trip" configuration provides that reciprocal non-idealities are cancelled and the magnetic field effect is doubled.

The phase shift caused by the magnetic field is a function of the current flowing in the conductor, and there are two main properties that affect how much phase shift is measured for a given current, also called the "scaling" of the current sensor. The first of these is the quality of the quarter wave plate. The quarter wave plate defines the beginning of the sensing region, where the beams are polarized, and the end of the sensing region for the returning light. An imperfect quarter wave plate gives rise to impure beams, and consequently a change in the scaling of the sensor.

The second property that affects the scaling of the sensor is the magnetic sensitivity of the sensing fiber itself. The sensitivity of the fiber to the effects of a magnetic field is described by the Verdet constant of the fiber.

The properties described above that affect the scaling of the sensor (the quarter wave plate quality and the Verdet constant of the fiber) are functions of temperature. Current sensors are used for the measurement of large DC currents, and the conductors that carry these currents are large and generate significant heat. Because of this, there can be large temperature gradients around the conductor, which reduces the ability of the current sensor to maintain an accurate scale factor.

It is currently known to measure the temperature of components of an optical current sensor, and correct any error in the current sensor output caused by an increase in temperature. However, there are still problems with accuracy in determining the measured current.

BRIEF SUMMARY OF THE INVENTION

An improved optical interferometer includes an optical fiber for extending around a conductor. The optical fiber forms a path for a beam of light. A quarter wave plate is formed in the optical fiber, and a mirror is formed near an end of the optical fiber. The interferometer measures current through the conductor based upon the effect the magnetic field that is produced by current flowing through the conductor has on light passing through the optical fiber. The improvement comprises a gap formed between the quarter wave plate and the mirror, wherein the gap is smaller than a predetermined maximum gap for minimizing the magnetic field passing through the gap.

The maximum gap is preferably less than about 15 millimeters, more preferably less than about 12 millimeters, still more preferably less than about 6 millimeters, and most preferably less than about 2 millimeters. The maximum gap is preferably less than about 0.02 percent of the length of the optical fiber.

The preferred optical interferometer includes a magnetic shield around a substantial portion of the gap for further minimizing a magnetic field passing through the gap. More preferably, a magnetic shield is formed around a substantial portion of a modulator. It is contemplated that magnetic shielding is formed around a substantial portion of a housing containing at least the gap, a modulator and a compensation coil. The magnetic shield preferably reduces the magnetic field at the gap to less than about 100 Gauss, more preferably to less than about 50 Gauss, and most preferably to less than about 15 Gauss.

By reducing the size of the gap between the quarter wave plate and the mirror, the amount of magnetic field produced by the current flowing through the conductor that passes through the loop formed by the optical fiber is reduced. This produces improved accuracy in the measurement of the current flowing through the sensor. Additionally, by shielding the components of the interferometer from magnetic fields, including the field produced by the current carrying conductor, errors in current measurement are further minimized.

Figure 1:
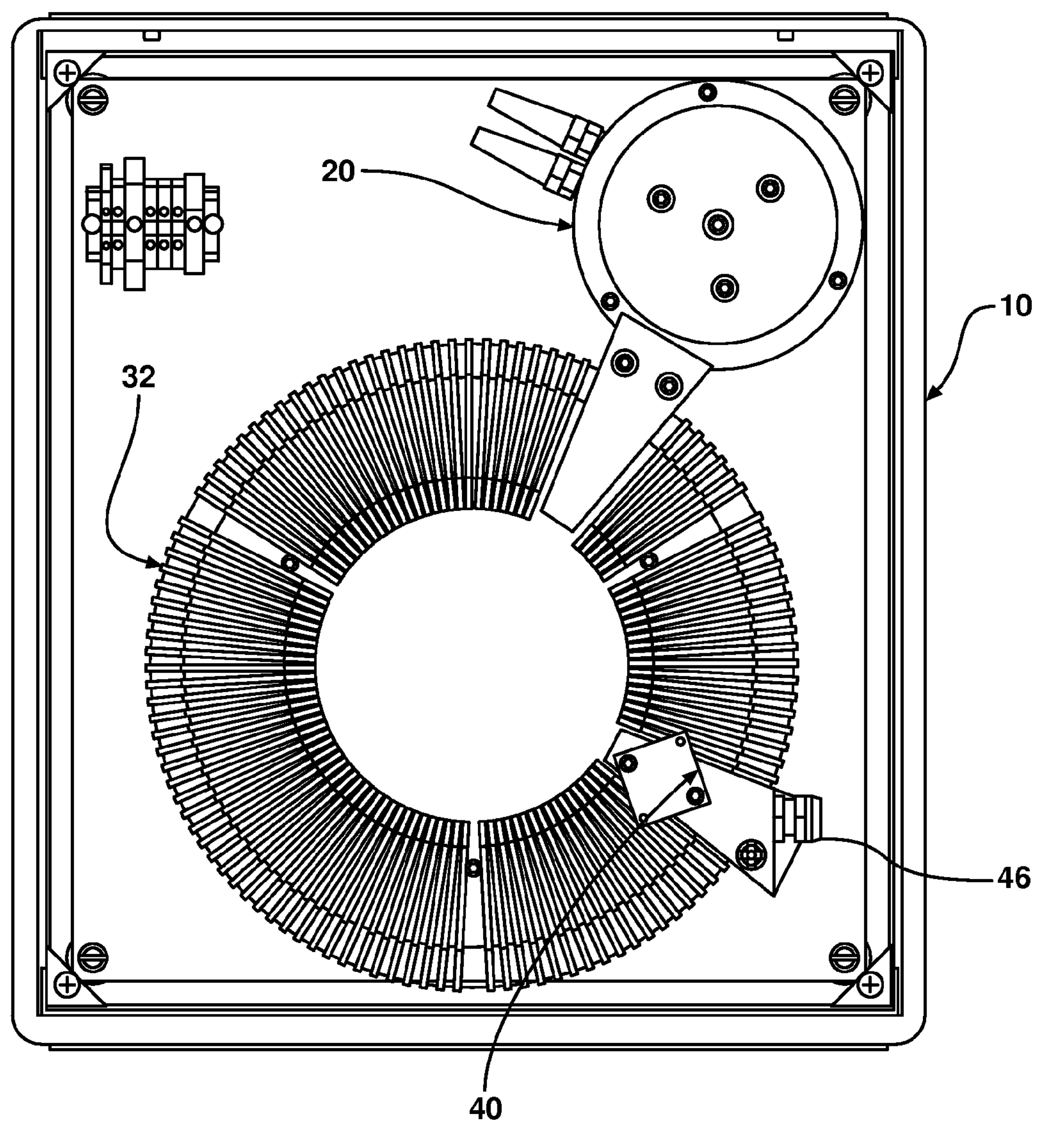
FIG. 1 is a plan view illustrating many of the components of the preferred embodiment of the invention.

In describing the preferred embodiment of the invention that is illustrated in the drawings, specific terminology will be resorted to for the sake of clarity. However, it is not intended that the invention be limited to the specific term so selected and it is to be understood that each specific term includes all technical equivalents that operate in a similar manner to accomplish a similar purpose. For example, the word connected or terms similar thereto are often used. They are not limited to direct connection, but include connection through other elements where such connection is recognized as being equivalent by those skilled in the art.

DETAILED DESCRIPTION OF THE INVENTION

As shown in FIG. 1, a case 10 houses elements of the components of a current sensing apparatus. Many of the components of the apparatus are known in the art, and are not illustrated or described in detail herein. As a general principle, a light source sends light through a waveguide to a linear polarizer and then to a splitter to create two linearly polarized light waves that are then modulated by the modulator 20. The light goes out of the modulator 20 through an optical fiber 30 (see FIG. 2) in a loop around the current carrying conductor (not shown) after first passing through a quarter waveplate 36 (see FIG. 7) that creates right and left hand circularly polarized light from the two linearly polarized light waves. The two light waves traverse the fiber 30 loop, reflect off a mirror 50 at the end of the fiber 30 and return around the same path with opposite circular polarization.

As is known in the art, because the fiber encircles the conductor, the magnetic field induced by the current flowing in the conductor creates a differential optical phase shift between the two light waves due to the Faraday effect. The two optical waves travel back through the optical circuit and are examined for the phase shift in a conventional manner. Because the electrical current through the conductor creates a magnetic field that is proportional to the current, and because the phase shift is a function of the magnetic field, once the phase shift is known, the amount of current in the conductor can be determined.

The features of the invention relate to the new structures and new relationships between structures that reduce the error in the determination of current in the conductor that arises due to effects of magnetic fields. One feature of the invention is the relationship between the mirror 50 and the quarter wave plate 36.

Figure 2:
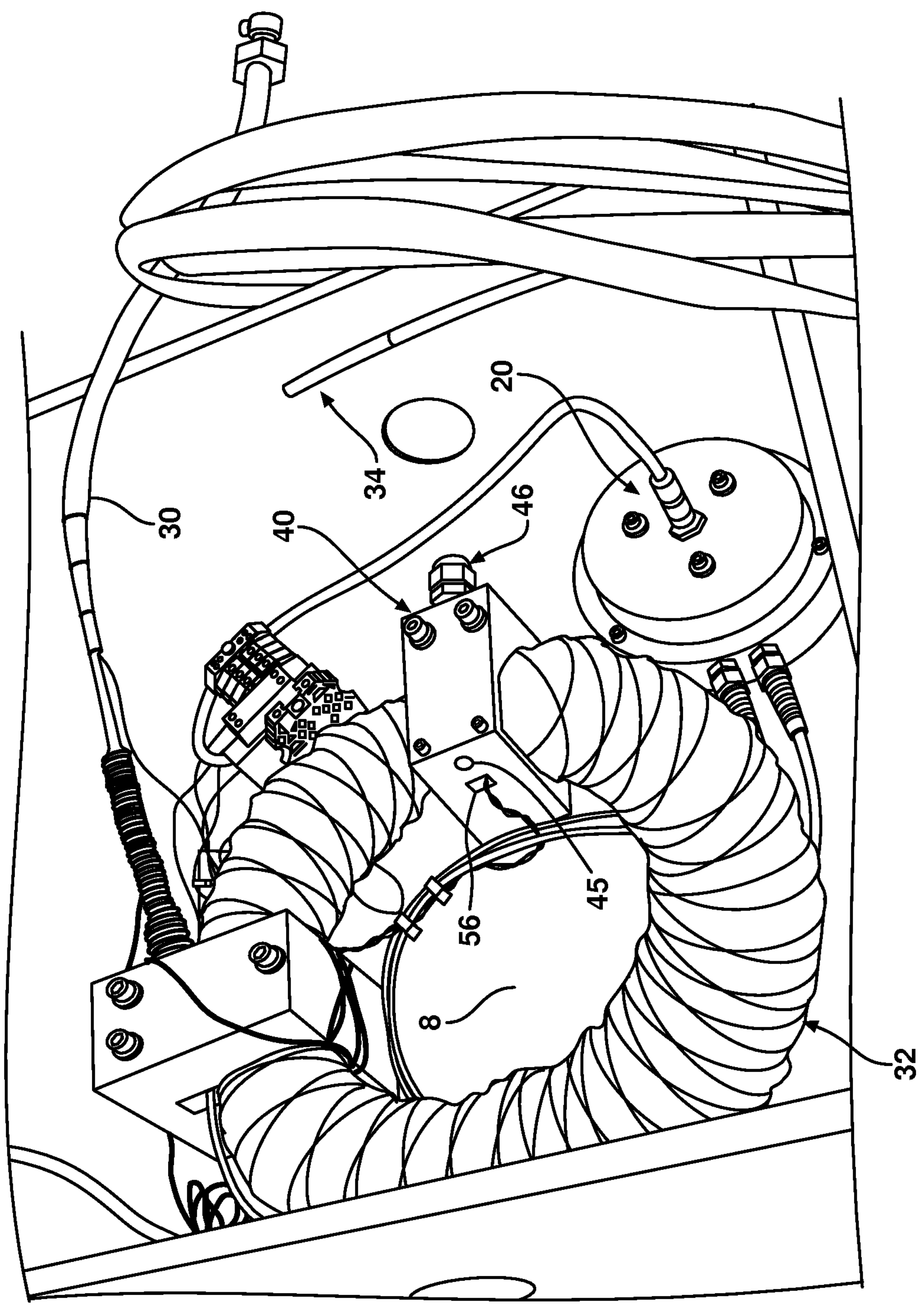
FIG. 2 is a view in perspective illustrating the preferred embodiment of the present invention.
Figure 3:
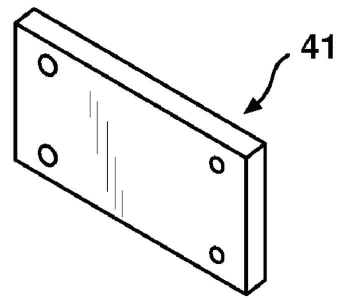
FIG. 3 is a view in perspective illustrating a plate component of a mirror block of the present invention.
Figure 4:
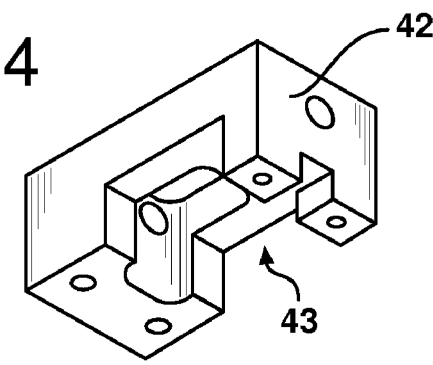
FIG. 4 is a view in perspective illustrating a body component of the mirror block.
Figure 5:
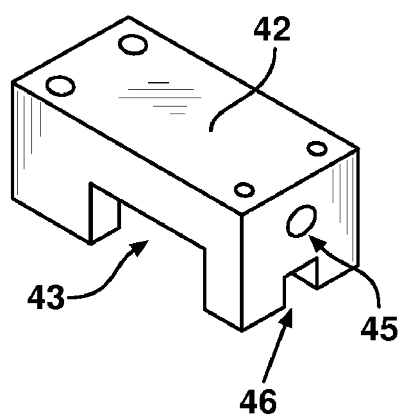
FIG. 5 is a view in perspective illustrating the body component of the mirror block from another perspective.

In the embodiment shown in FIGS. 1 and 2, the optical fiber 30 is coiled in the case 10 an integral number of times to form the coil 32. The quarter wave plate 36 (shown schematically in FIG. 7) is created in a conventional manner by creating a physical structure in the optical fiber 30, and the quarter wave plate is positioned in the coil 32 at the mirror block 40. The mirror block 40 is a preferably steel block having a plate 41 and a body 42 that enclose the coil housing 32', which is hollow and through which the fiber 30 extends. The body 42 has a channel 43 into which the coil housing 32' is inserted. The plate 41 clamps the coil housing 32' in the channel by fasteners inserted through apertures in the plate 41 and are fixed in the body 42.

Figure 7:
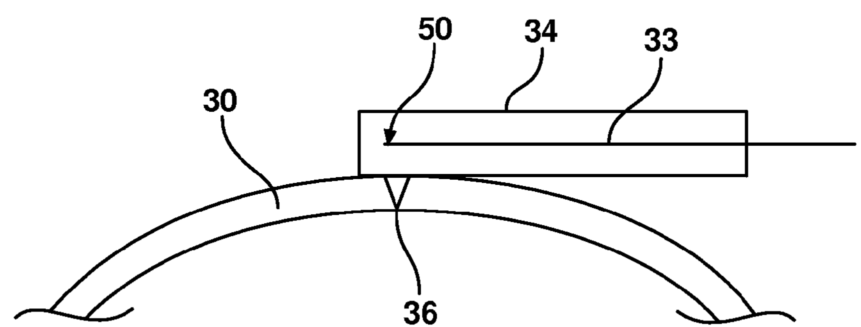
FIG. 7 is a schematic illustration of the gap between the quarter waveplate and the mirror of the present invention.

The end of the fiber 30 at which the mirror 50 is formed, in a conventional manner such as by forming a film over the end of the optical fiber, is encased within a protective tube 34, as shown in FIGS. 2 and 7. The tube 34 is attached to the outer sheathing of the optical fiber 30, as shown in FIG. 2, and the fiber 30 "floats" within the tube 34 with space on both sides and the end from the mirror 50, as illustrated schematically in FIG. 7.

Figure 6:
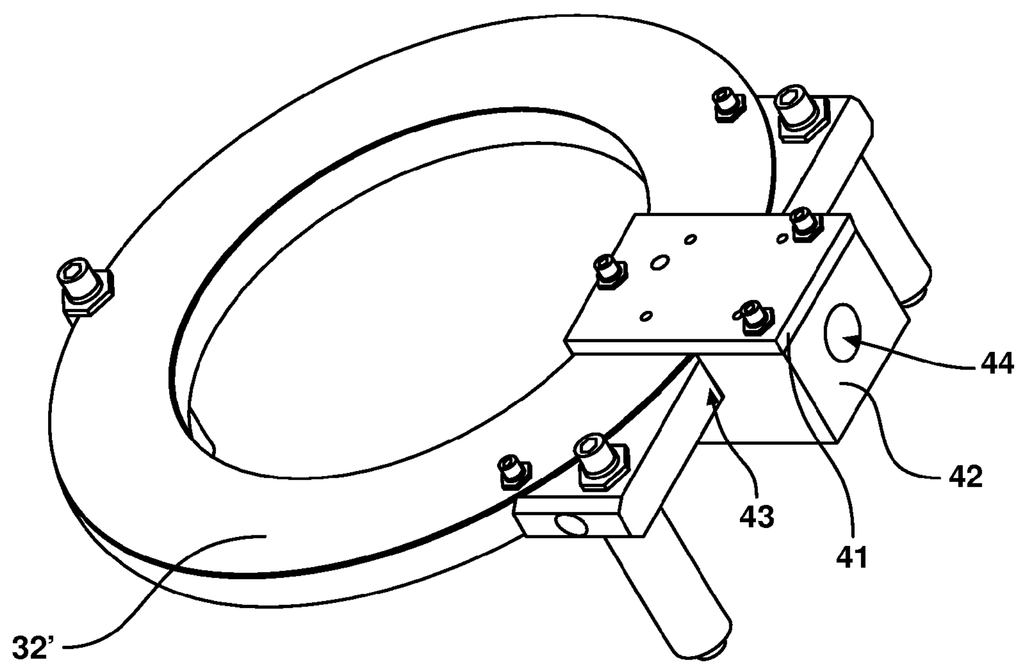
FIG. 6 is a view in perspective illustrating a coil frame of the present invention.

The tube 34 is inserted into the mirror block 40 through the aperture 44 illustrated in FIG. 6. In a preferred embodiment, once the tube 34 is inserted in the aperture 44, the position of the mirror 50 relative to the quarter wave plate 36 (see FIG. 7) is adjusted. Once the desired position is attained, as described below, the rotary clamp 46 is tightened around the sheathing of the fiber 30 to clamp the fiber 30 and, therefore, the mirror 50 in the desired position.

It is a feature of the invention to position the mirror 50 as close to the quarter wave plate 36 as is practical. This is accomplished by first positioning the quarter wave plate 36 within the channel 43 of the body 42, and as close to the axis of the aperture 44, as is possible. Then the tube 34 is mounted in the body 42 with the mirror 50 positioned as close to the quarter wave plate 36 as possible. Then the clamp 46 is tightened. Thus, any gap between the quarter wave plate 36 and the mirror 50 is as small as possible.

Because the mirror 50 is not visible due to the covering of the tube 34, this gap cannot typically be minimized by visual inspection. One way the proximity of the mirror 50 to the quarter wave plate 36 can be assessed is by trial and error. For example, the relative positions can be fixed and the device tested for accuracy. Then the relative positions can be modified and the device tested again. If improvements in accuracy are noticed, the tube 34 is moved and another test performed. This continues until the smallest error is recorded. Then the clamp 46 is fully tightened.

Alternatively, the positions of the mirror 50 and the quarter wave plate 36 can be marked, or otherwise detected, for example using x-ray, magnetic resonance imaging (MRI) or other inspection techniques, and mounted as close to one another as possible to reduce the gap therebetween. Still further, a magnetic test can be performed, such as by passing a strong magnet over any parts of the device that are sensitive to magnetic fields. The system is monitored for accuracy during the movement of the magnet. The mirror in the tube 34 is moved to each of a plurality of different positions in the block, and the magnet is again passed over the region. After the tube 34 has been placed at each possible position in the range, the tube 34 is mounted at that position at which the system shows optimal accuracy while the magnet is passed over the area being tested. Any method of positioning the mirror 50 as close to the quarter wave plate 36 as possible is contemplated in order to obtain a predetermined maximum gap size.

It is theorized that the accuracy of the current sensing device is improved by minimizing the gap between the mirror 50 and quarter wave plate 36 due to a portion of the magnetic field created by the current carrying conductor being measured passing through this gap. When the gap is large, a large amount of the magnetic field passes through the gap and does not have an effect, or has less of an effect, on the phase shift in the fiber 30 passing around the conductor. This causes the error detection to be less accurate. When the gap is small, less of the magnetic field passes through the gap, and therefore becomes a part of the correction of the invention. If the gap could be closed completely, then the measurement should be ideal. However, this is not possible in most practical situations, and therefore a maximum gap size, which is quite small, is permitted.

The size of the gap is as small as possible, and is preferably infinitesimal. Of course, it is known that there will essentially always be some finite gap size. However, the most benefit obtained is when the gap is less than 0.02 percent of the total length of the fiber, assuming that the fiber and the gap are exposed to essentially the same magnetic field levels. Thus, for a typical fiber in an apparatus with which the invention is used, a gap of 0.0 to 12 millimeters is preferred, a gap of 0.0 to 6 millimeters is more preferred, and a gap of 0.0 to 2 millimeters is most preferred. A gap of about 15 millimeters or greater is not a small enough gap to meet the requirements of the present invention. Thus, it is critical that the gap be smaller than about 15 millimeters for the apparatus used herein.

Minimizing gap alone obtains a substantial improvement. However, in a more preferred embodiment of the invention, the body 42 and the plate 41 are made of magnetic shielding material, in order that they shield the gap from magnetic fields. For example, the body 42 and the plate 41 are preferably made of steel, which offers substantial magnetic shielding for low cost in a material that is relatively easily shaped. Other materials that are contemplated are low carbon steel, such as 1018, 1020, 1117, 1010, 1006 and pure steel. Of course, other steel compositions can be used. Additionally, higher permeability material can be used, such as nickel (78-80%) iron alloy, such as that sold under the trademarks HYMU80, HIPERNOM, PERMALLOY 80 and MUMETAL. Another nickel iron alloy (48-52% nickel) can be used, and is sold under the trademarks CARPENTER HIGH PERMEABILITY "49", ALLOY 48 and MAGNIFIER 50, among others. The latter group is considered medium permeability materials. Of course, these are only examples of suitable materials. A person having ordinary skill will be aware of other suitable materials currently in existence, or which may come into existence, that can substitute for the materials described herein.

The desired magnetic shields preferably have multiple layers of the shielding material with an air gap between each layer. The outermost layer is of the highest permeability material, the inner layer is of the lowest permeability and a middle layer is of a medium permeability material. Material thicknesses have not been optimized, although it is considered advantageous to have steel of between around one-eighth to one-quarter of one inch thick. Of course, other thicknesses are contemplated.

It is preferred that any holes in the shields be small enough to minimize the penetration of the magnetic field into the shields. Therefore, it is preferred that the holes 44, 45 and 56, through which the tube 36 and the wire (see FIG. 2) extend be as small as is practical.

Figure 8:
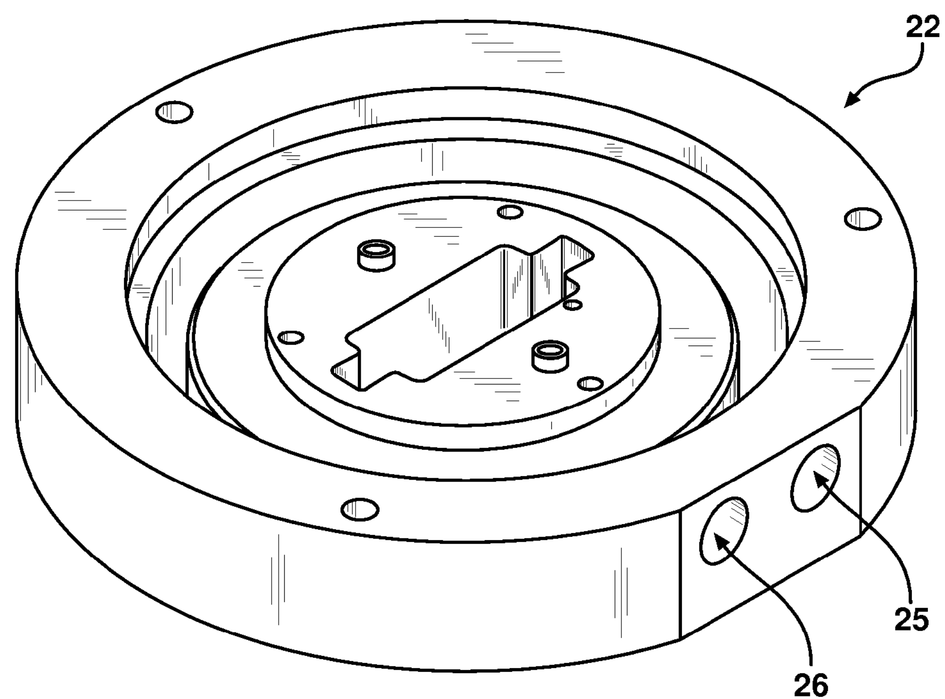
FIG. 8 is a view in perspective illustrating a lower shielding component of a modulator shield of the present invention.
Figure 9:
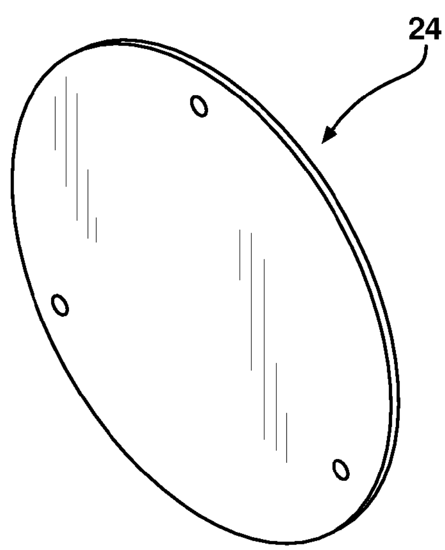
FIG. 9 is a view in perspective illustrating a middle shielding component of the modulator shield.
Figure 10:
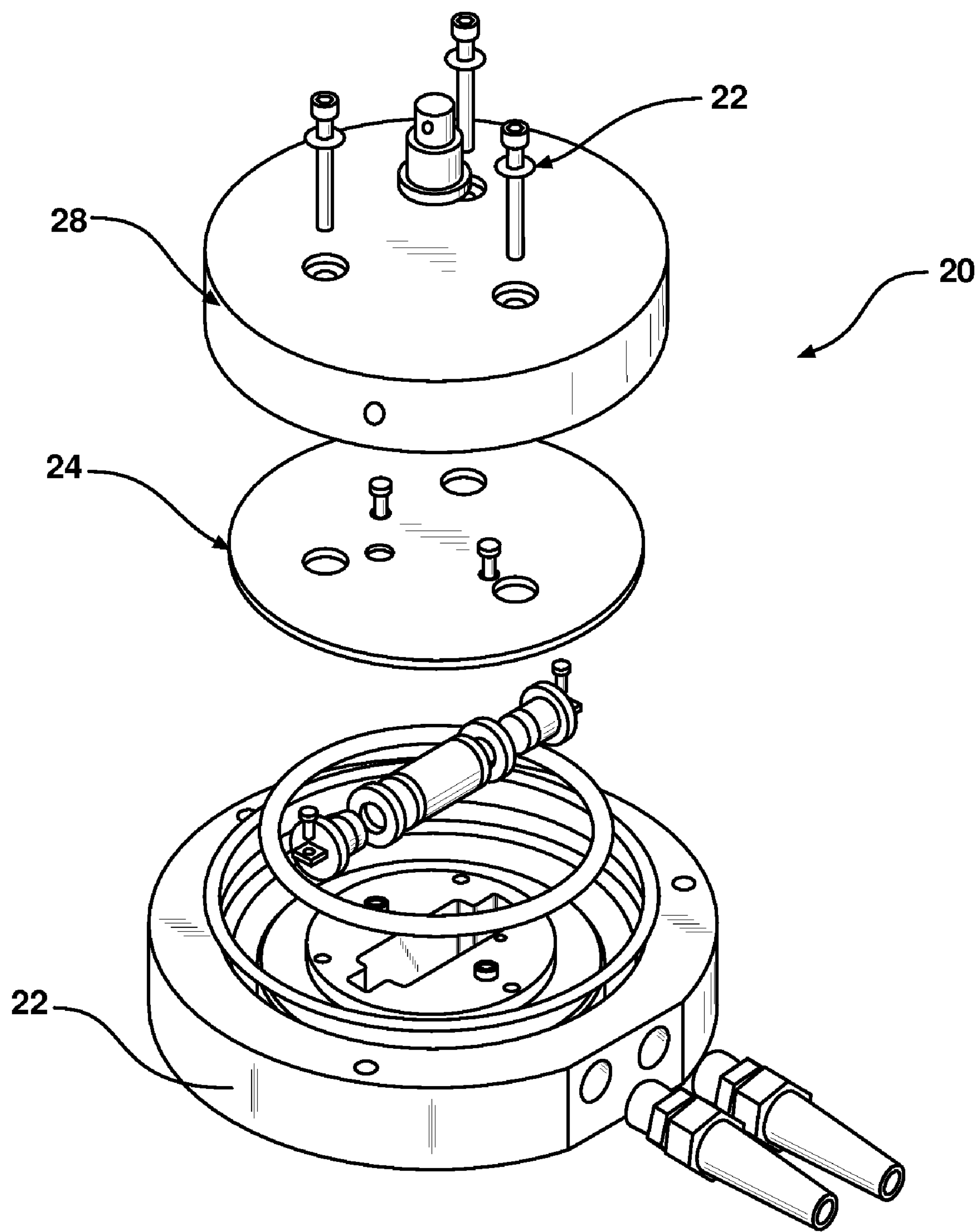
FIG. 10 is an exploded view in perspective illustrating an upper shielding component of the modulator shield and its relationship to the middle and lower shielding components.

The modulator 20 is also shielded by the shields 22, 24 and 28, as shown in FIGS. 8, 9 and 10. The lower shield 22 mounts to the floor 8 of the case 10, and the middle shield 24 mounts to the lower shield 22. The upper shield 28 mounts to the top of the lower shield 22 as shown in FIG. 10. The apertures 25 and 26 permit exit of the fiber 30 as shown in FIG. 2.

The same desirable shielding characteristics described above for the body 42 and the plate 41 apply to the shields 22, 24 and 26, as do the minimization of the size of the apertures 25 and 26 and any other apertures. Of course, it is understood that not all advantageous features can be incorporated into every design, and therefore only one, two or a few of the advantageous features might be able to be incorporated. However, a limited improvement is still substantially improved over the prior art.

Another manner of quantifying the shielding that provides advantageous results is to describe the amount of magnetic field that is present inside the modulator shielding and at the gap between the quarter wave plate and the mirror. For example, the magnetic field in these critical locations is preferably less than 200 Gauss, more preferably less than 100 Gauss, and most preferably less than 30 Gauss. Obviously, the lower limit of exposure is 0.0 Gauss, but this is not normally feasible.

Additionally, if feasible, it is most preferred that the entire case 10, including a floor 8 and removable lid (not shown) be made of magnetic shielding material of the types described herein. This provides substantial shielding of the critical components of the apparatus by the very housing of those components. However, this has practical limitations, such as weight and cost that, unless overcome, would limit the ability of such shielding to be implemented.

This detailed description in connection with the drawings is intended principally as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention and that various modifications may be adopted without departing from the invention or scope of the following claims.

The invention claimed is:

1. An improved optical interferometer including an optical fiber for extending around a conductor, thereby forming a path for a beam of light, a quarter wave plate in the optical fiber and a mirror near an end of the optical fiber, for measuring current through the conductor based upon an effect of a magnetic field, produced by current flowing through the conductor, on light passing through the optical fiber, the improvement comprising a gap formed between the quarter wave plate and the mirror being smaller than a predetermined maximum gap for minimizing the magnetic field passing through the gap, wherein said predetermined maximum gap is less than about 15 millimeters.

2. The improved optical interferometer in accordance with claim 1, further comprising a magnetic shield around a substantial portion of the gap for further minimizing a magnetic field passing through the gap.

3. The improved optical interferometer in accordance with claim 1, wherein said predetermined maximum gap is between about 0.0 and about 12 millimeters.

4. The improved optical interferometer in accordance with claim 3, wherein said predetermined maximum gap is between about 0.0 and about 6 millimeters.

5. The improved optical interferometer in accordance with claim 4, wherein said predetermined maximum gap is between about 0.0 and about 2 millimeters.

6. The improved optical interferometer in accordance with claim 2, wherein said predetermined maximum gap is less than about 0.02 percent of the length of the optical fiber.

7. The improved optical interferometer in accordance with claim 2, further comprising a magnetic shield formed around a substantial portion of a modulator.

8. The improved optical interferometer in accordance with claim 1, further comprising a magnetic shield formed around a substantial portion of a housing containing at least the gap and a modulator and a compensation coil.

9. The improved optical interferometer in accordance with claim 2, wherein the magnetic shield reduces the magnetic field at the gap to less than about 200 Gauss.

10. The improved optical interferometer in accordance with claim 9, wherein the magnetic shield reduces the magnetic field at the gap to less than about 100 Gauss.

11. The improved optical interferometer in accordance with claim 10, wherein the magnetic shield reduces the magnetic field at the gap to less than about 30 Gauss.

12. An improved optical interferometer including an optical fiber for extending around a conductor, thereby forming a path for a beam of light, a quarter wave plate in the optical fiber and a mirror near an end of the optical fiber, for measuring current through the conductor based upon an effect of a magnetic field, produced by current flowing through the conductor, on light passing through the optical fiber, the improvement comprising a magnetic shield around a substantial portion of a gap formed between the quarter wave plate and the mirror for minimizing a magnetic field passing through the gap.

13. The improved optical interferometer in accordance with claim 12, further comprising the gap being smaller than a predetermined maximum gap for further minimizing the magnetic field passing through the gap.

14. The improved optical interferometer in accordance with claim 13, wherein said predetermined maximum gap is less than about 15 millimeters.

15. The improved optical interferometer in accordance with claim 14, wherein said predetermined maximum gap is between about 0.0 and about 12 millimeters.

16. The improved optical interferometer in accordance with claim 15, wherein said predetermined maximum gap is between about 0.0 and about 6 millimeters.

17. The improved optical interferometer in accordance with claim 16, wherein said predetermined maximum gap is between about 0.0 and about 2 millimeters.

18. The improved optical interferometer in accordance with claim 13, wherein said predetermined maximum gap is less than about 0.02 percent of the length of the optical fiber.

19. The improved optical interferometer in accordance with claim 13, further comprising a magnetic shield formed around a substantial portion of a modulator.

20. The improved optical interferometer in accordance with claim 13, further comprising a magnetic shield formed around a substantial portion of a housing containing at least the gap and a modulator and a compensation coil.

21. The improved optical interferometer in accordance with claim 13, wherein the magnetic shield reduces the magnetic field at the gap to less than about 200 Gauss.

22. The improved optical interferometer in accordance with claim 21, wherein the magnetic shield reduces the magnetic field at the gap to less than about 100 Gauss.

23. The improved optical interferometer in accordance with claim 22, wherein the magnetic shield reduces the magnetic field at the gap to less than about 30 Gauss.

24. A method of minimizing error in an optical interferometer including an optical fiber extending around a conductor, thereby forming a path for a beam of light, a quarter wave plate in the optical fiber and a mirror near an end of the optical fiber, for measuring current through the conductor based upon an effect of a magnetic field, produced by current flowing through the conductor, on light passing through the optical fiber, the method comprising:

(a) forming a gap between the quarter wave plate and the mirror;

(b) adjusting the size of the gap to minimize the magnetic field passing through the gap.

25. The method in accordance with claim 24, wherein the adjusting step further comprises:

(a) moving the optical fiber to a first position;

(b) determining an error when the optical fiber is at the first position;

(c) moving the optical fiber to a second position;

(d) determining an error when the optical fiber is at the second position;

(e) comparing the error when the optical fiber is at the first position to the error when the optical fiber is at the second position;

(f) moving the optical fiber to a position that further minimizes error; and then (g) fixing the optical fiber in position.

* * * * *